(12) United States Patent
Hester et al.

(10) Patent No.: US 7,988,787 B2
(45) Date of Patent: Aug. 2, 2011

(54) WORKPIECE SUPPORT SYSTEM AND METHOD

(75) Inventors: Virgil R. Hester, Edelstein, IL (US); Jeffrey P. Werner, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 889 days.

(21) Appl. No.: 11/845,601

(22) Filed: Aug. 27, 2007

(65) Prior Publication Data
US 2009/0056630 A1 Mar. 5, 2009

(51) Int. Cl.
C23C 16/00 (2006.01)
C23F 1/00 (2006.01)
H01L 21/306 (2006.01)
(52) U.S. Cl. .................... 118/730; 156/345.55
(58) Field of Classification Search ........... 118/500, 118/728, 730; 156/345.55; 204/199, 212; 216/72, 783, 231, 425, 480, 481, 484; 427/270, 427/345.55, 481; 475/11, 331, 332, 903; 901/41
See application file for complete search history.

(56) References Cited

U.S. PATENT DOCUMENTS
6,761,772 B2 * 7/2004 Giacri et al. .................. 118/730
7,081,166 B2 * 7/2006 Zaech et al. .................. 118/728
* cited by examiner

*Primary Examiner* — Parviz Hassanzadeh
*Assistant Examiner* — Tiffany Nuckols
(74) *Attorney, Agent, or Firm* — Leydig, Voit & Mayer (57) ABSTRACT

A workpiece support system for a vacuum coating machine includes a base table having a rotating spindle rod that extends in a vertical direction away from the base table and is capable of powered rotation. A stop post is connected to the table and extends in a vertical direction at a distance from the spindle rod. A workpiece support module is connected to the spindle rod and the stop post, and includes a rotating table with peripheral openings arranged symmetrically around its periphery, a plurality of cogs positioned in the openings, a stationary table connected to the stop post and axially supporting the rotating table, and a driver finger connected to the stationary table. At least one bearing is located around the spindle rod and rotatably isolates the rotating table from the stationary table.

12 Claims, 6 Drawing Sheets

WORKPIECE SUPPORT SYSTEM AND METHOD

TECHNICAL FIELD

This patent disclosure relates generally to fixtures for supporting workpieces during a coating process and, more particularly, to fixtures that support and re-orient workpieces to achieve a uniform deposition of coating material onto the workpieces during the coating process.

BACKGROUND

Workpiece coatings can be applied in many different ways. In some instances, a coating material is supplied within a chamber, usually a vacuum chamber, through a sprayer that accelerates the coating vapor and deposits it onto one or more workpieces positioned within the chamber. Alternatively, the coating material may be evaporated from a pool of material, filling the deposition chamber and condensing onto the workpieces. In other instances, the coating material may be atomized to create an aerosol that condenses onto the workpieces. Condensation of the coating material can be accomplished by various methods, for example, by physical methods or chemical methods. In a typical configuration, one or more nozzles or outlets for the coating material are positioned within the chamber, and the workpieces are rotated in front of the nozzles while the nozzles are operating to achieve a uniform deposition coating on each workpiece.

One known device for coating a plurality of workpieces is described in U.S. Pat. No. 6,761,772, issued to Giacri at al. on Jul. 13, 2004 (hereafter the '772 patent). The '772 patent describes a device that supports and rotates eight (8) workpieces simultaneously during a coating process. The workpieces are rotatably mounted at the edge of a turntable that is connected to a drive shaft. As the turntable rotates, a finger engages a tooth formed on a drive wheel that lies beneath each workpiece. This engagement operates to incrementally rotate each workpiece as it passes in front of the finger, exposing an incrementally new profile of the workpiece to the vapor emanating from a respective nozzle. The disclosure of the '772 patent describes that the finger is connected to an extension of a rotating ring which is mounted on the turntable itself. The rotating ring is connected to the turntable such that the two components can rotate with respect to each other, but are also connected to each other. The extension is arranged to cooperate with a rod serving as a stop, in such a way that rotation of the driving device together with the turntable is prevented.

One disadvantage of the device disclosed in the '772 patent is the relatively large frictional interface between the rotating ring and the turntable. Because of operation of the device in an environment where large amounts of coating material are present, any deposition of coating material within the interface between the turntable and the ring that is attached thereto may cause an increase in friction between the two components, which in turn places a larger burden in the actuator that acts to rotate the turntable. Further, the peripheral interface between the rotating ring and the turntable is near the source of coating material in that the coating material is sprayed onto the workpieces from above and off the side of the assembly. Moreover, the disclosed device is limited to providing two degrees of compounded rotation inasmuch as the rotation of the turntable is compounded with the incremental rotation of each of the workpieces.

SUMMARY

The disclosure describes, in one aspect, a workpiece support system that includes a base table having at least one rotating spindle rod associated therewith. The spindle rod extends in a vertical direction away from the base table and is capable of powered rotation about its centerline. At least one stop post having an elongate shape is connected to the table and extends parallel to the spindle rod. At least one workpiece support module is installed onto the machine around the spindle rod. The workpiece support module includes a rotating table having a central opening and a plurality of peripheral openings. The peripheral openings are arranged symmetrically around a peripheral portion of the rotating table. The rotating table engages the spindle rod such that the rotating table rotates when the spindle rod rotates. A plurality of cogs are located, one each, into the plurality of peripheral openings. Each cog is connected to a workpiece and can rotate about a respective axis that is parallel to the centerline of the spindle rod. A stationary table that is freely disposed around the spindle rod, axially supports the rotating table along the centerline. The stationary table is connected to the at least one stop, such that the stationary table remains stationary when the spindle rod rotates. A driver finger is connected to the stationary table and at least one bearing is positioned around the spindle rod. The at least one bearing is located between and separates the rotating table from the stationary table and rotatably isolates the rotating table from the stationary table. The driver finger sequentially engages each of the at least one teeth of the plurality of cogs, once per full revolution of the rotating table, such that an angular position of each of the plurality of cogs is incrementally advanced with respect to the rotating table.

In another aspect, a method is disclosed for supporting and dynamically orienting at least one workpiece during a vapor coating operation. The method includes rotating a table having at least one workpiece associated therewith. The at least one workpiece is located adjacent to an outer periphery of the rotating table and can rotate with respect to the rotating table. The at least one workpiece is associated with a respective workpiece holder that has a toothed cog connected therewith. Each tooth on each cog is sequentially engaged by a driver finger that is connected to the stationary table, with one tooth per workpiece being engaged once per revolution of the rotating table. Each revolution of the rotating table thus incrementally advances the angular position of the at least one workpiece holder with respect to the rotating table. The rotating table is vertically supported by a bearing that is located between the rotating table and the stationary table. The bearing that separates the rotating table from the stationary table advantageously isolates and separates the two components from each other.

In yet another aspect, a fixture for supporting a plurality of workpieces within a vacuum chamber during a vapor deposition coating is disclosed. The fixture includes a base rotating table having two or more spindle rods extending vertically therefrom. Each spindle rod has a corresponding stop post associated therewith that is connected to the base rotating table and defines at least one stop opening. Each spindle rod rotates about a centerline thereof, such that the rotation of each spindle rod is compounded with the rotation of the base rotating table. A spacer sleeve can be located around, but not engaged with, each spindle rod. A first bearing having a race portion that is rotatably isolated from a bearing portion is positioned around the spindle rod. A stationary plate located around the spindle rod can contact the first bearing such that it is rotatingly isolated from the rotation of the spindle rod. The stationary plate may have a projection arm that is at least partially engaged with the stop opening such that the stationary plate does not rotate with respect to the base table when the spindle rod is rotating. A second bearing can be positioned over the stationary plate and be used to provide support to a workpiece support plate. The workpiece support plate can be engaged with the spindle rod and be free to rotate when the spindle rod rotates.

DETAILED DESCRIPTION

This disclosure relates to a support system for workpieces undergoing a coating process. The support system disclosed herein is advantageously capable of continuously re-orienting workpieces that are placed thereon with respect to sources of vaporized coating material. The structure disclosed can advantageously re-orient the workpieces in up to three degrees of compounded rotation simultaneously. Moreover, the disclosed embodiments represent structures that are not as prone to debris intrusion and to an increase of friction during their rotation as are other known machines.

Figure 1:
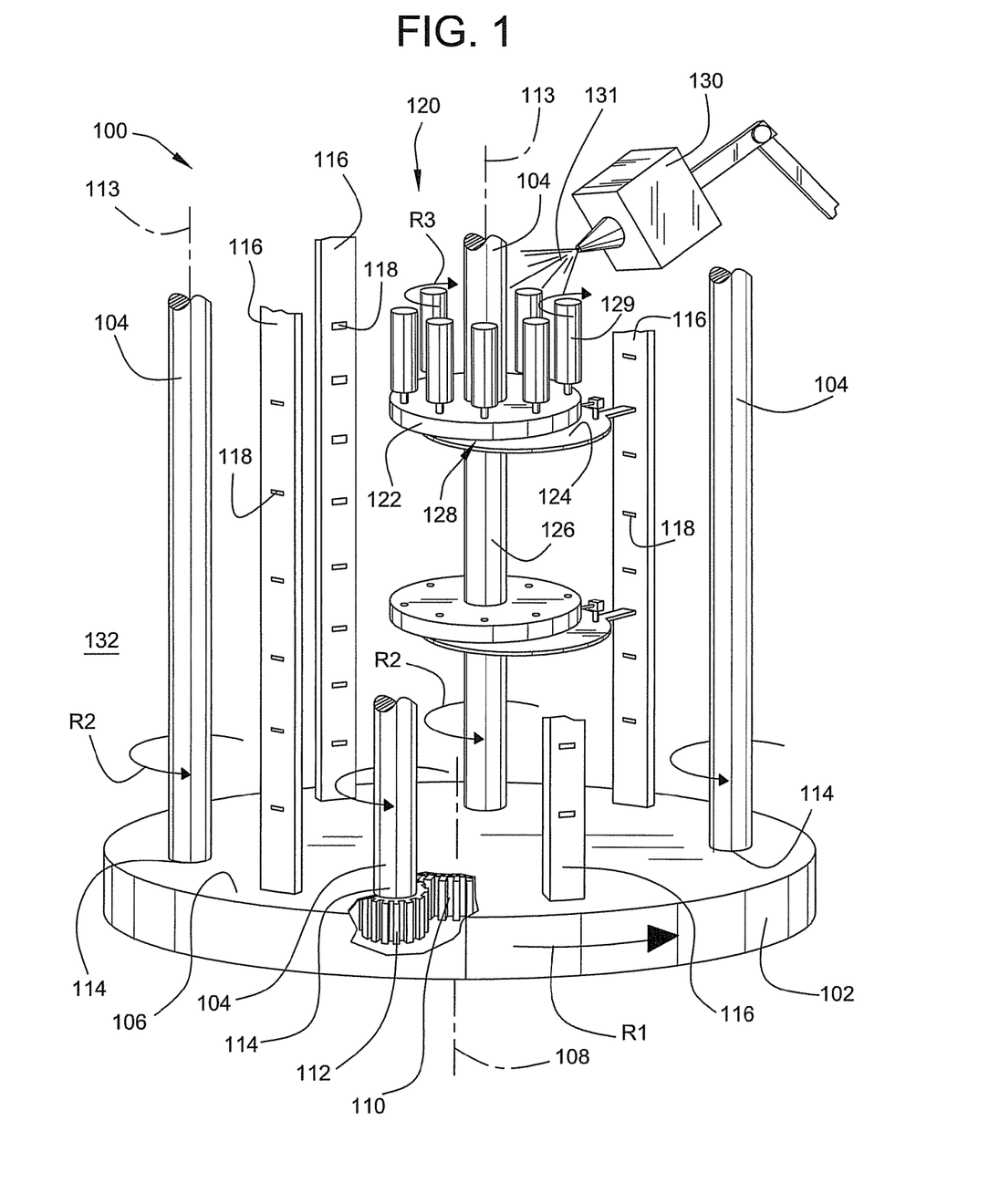
FIG. 1 is an outline view of a workpiece support machine, with a few components shown partially cut away for clarity, in accordance with the disclosure.

An outline view of a workpiece support system 100 is shown in partial break-away in FIG. 1. The system 100 is shown with a number of components removed or partially cut away for clarity. The system 100 includes a base rotating table 102 having a plurality of spindle rods 104 extending vertically therefrom. In the embodiment shown, four spindle rods 104 are connected to the base table 102, but other configurations employing any other number of spindle rods connected to the table, for example, twelve, may be used. The spindle rods 104 are arranged peripherally around an outer portion 106 of the base 102. In this embodiment, the base 102 is arranged to rotate about a central axis 108. A central pinion 110 is enclosed within the base 102 and arranged to rotate with respect to the base 102. The central pinion 110 may be in meshed engagement with one or more gears 112. Each of the gears 112 is included within the base 102 and connected to a lower end 114 of each spindle rod 104. In this arrangement, a rotating motion of the base 102 can cause the pinion 110 to rotate, which in turn causes each of the gears 112 to rotate, thus, rotating each of the spindle rods 104 with respect to the rotating base 102. As can be appreciated, this arrangement can be modified by use of idler gears (not shown) disposed between the central pinion 110 and each of the gears 112, and/or different gear ratios may alternatively be used to achieve a rotation in the spindle rods 112 about a respective centerline 113 thereof. Rotation of the spindle rods 104 can be conducted in any direction and speed desired with respect to the rotation of the base 102. Alternatively, one or more motors or, in general, rotary actuators, may be integrated within the base 102 to operate the spindle rods 104.

A plurality of stop posts 116 are rigidly connected to the base 102 along the outer portion 106 thereof. Each of the posts 116 has a series of pre-formed openings 118 defined therein that extend along the entire length of reach post 116 at preset intervals. The openings 118 are optional and can be replaced, for example, with structures that can perform a similar retentive function as the openings 118.

One or more modular support structure(s) 120 can be stacked onto each of the spindle rods 104 during operation of the support system 100. In the illustration of FIG. 1, one complete structure 120 is shown connected around one of the spindle rods 104, but due to the modular nature and connectivity between each module 120 with a spindle rod 104, other configurations are possible that include more than one module 120.

Each modular support structure 120 includes a rotating table 122, a stationary table 124, one or more spacer sleeves 126, and one or more bearings 128. The rotating table 122 is adapted to support one or more workpieces 129. The various components described herein can be stacked over each other around the spindle rod 104. Each modular structure 120 is, advantageously, a discrete module that can be added in series with other like or different modules that are stacked over one another around the spindle 104. The relative spacing of modules 120 is adjustable to advantageously accommodate the maximum number of workpieces 129 possible during each coating operation. The spacer sleeves 126 can have varied lengths and may accordingly be used to variably space apart the modules 120 depending on the size of the workpieces 129 being coated.

A sprayer 130 is shown for illustration. The sprayer 130 may be one of a plurality of sprayers that are contained within a vacuum or coating chamber 132. The sprayer 130 may spray a coating material 131 in a liquid, or typically a vapor, form. Alternatively, the coating material 131 may evaporate from a pool of material (not shown) and saturate the chamber 132. When the sprayer 130 is used, it may be aimed toward the workpieces 129 and may advantageously provide a uniform coating of the material 131 thereon due to the orbital motion of the workpieces 129 within the chamber 132 while the system 100 is operating. This orbital motion of the workpieces 129 is the result of the compounded motion of the various components of the system 100. For example, one component of the motion or a first degree of rotation is the rotation of the entire spindle rod 104 while the base 102 is rotating (denoted by arrow R1). Another component of the motion or a second degree of rotation is the rotation of the spindle 104 itself about the centerline 113 thereof (denoted by arrow R2). Advantageously, each module 120 is capable of providing a third component or third degree of rotation to the workpieces 129 that are positioned thereon with respect to the centerline 113 (denoted by arrow R3).

Figure 2:
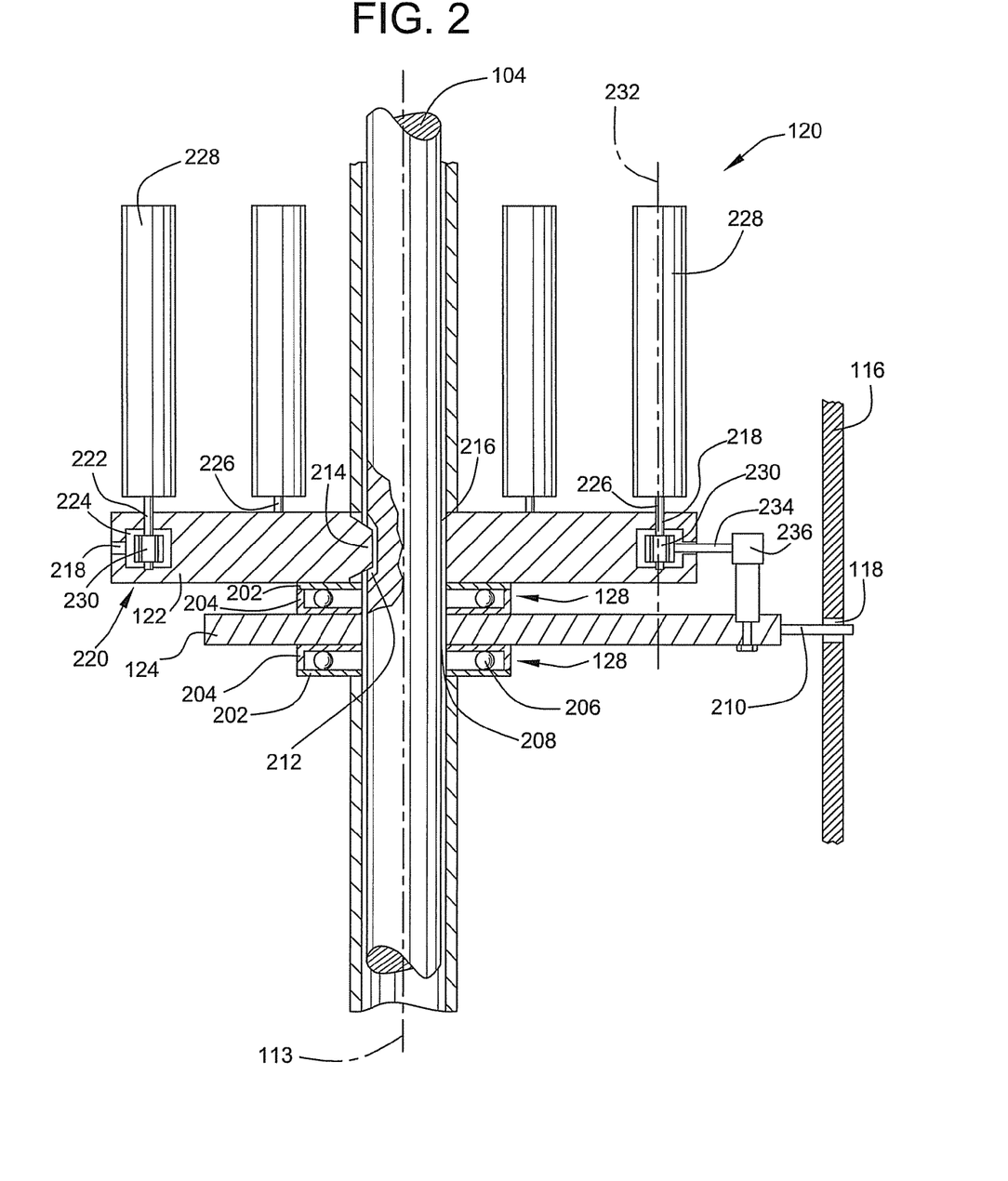
FIG. 2 is a cross section of a workpiece support module as installed around a spindle rod of the machine of FIG. 1 in accordance with the disclosure.

A cross-section view of a module 120 installed onto a spindle rod 104 is shown in FIG. 2. In this illustration, like reference numerals denote like features as previously described for the sake of simplicity. Here, an embodiment that includes two bearings 128 positioned on alternate sides of the stationary table 124 is presented. Each bearing 128 has a race portion 202 and a bearing portion 204. The bearings 128 can be of any suitable type. In this embodiment, a set of rollers 206 is located between the race portion 202 and the bearing portion 204 of the bearing 128 to facilitate rotational motion therebetween. The race portion 202 is sealably but slideably connected to the bearing portion 204 to inhibit the intrusion of any foreign matter, and particularly, intrusion of coating material into the inner portion of the bearing 128. As can be appreciated, intrusion of the coating material within sliding interfaces between the rotating table 122 and the stationary table 124 may adversely affect the coating process of the workpieces 129, and may even reduce the service life of the various motors and actuators that cause the various rotational motions of the system.

The stationary table 124 is advantageously not connected to either the spindle rod 104 or the rotating table 122. The stationary table 124 defines an opening 208 through which the spindle rod 104 can pass. A stop arm 210 extends outwardly from the stationary table 124 and engages one of the openings 118 defined in the stop posts 116 when the module 120 is installed onto the spindle rod 104. Even though the stationary table 124 is arranged to not rotate as the spindle rod 104 rotates, friction between the various components stacked over each other can cause a rotation of the stationary table 124 in the absence of a stop mechanism. The engagement between the stop arm 210 and the stop post 116 advantageously restricts rotation of the stationary table 124 while the spindle rod 104 is rotating. Moreover, the bearings 128 disposed on either side of the stationary table 124 help to further ensure not only that the stationary table 124 is rotatably isolated from surrounding components, but also that any friction that would have otherwise existed therebetween is reduced. Alternative arrangements can be used and are contemplated for the connection between the stationary table 124 and the stop post 116. For example, arrangements such as clamps, fasteners, and other similar arrangements may be used to restrain a relative rotational motion between the stationary table 124 and the stop post 116.

The spindle rod 104 may have a series of recesses or channels 212 formed along its length. The channels 212 may be a series of discrete features arranged lengthwise along an outer periphery of the rod 104, or may alternatively be formed as one continuous channel. When the rotating table 122 is disposed around the spindle rod 104, a protrusion or key feature 214 that is formed on the rotating table 122 and extends radially inward with respect to a central opening 216 defined in the rotating table 122 can engage the channel(s) 212 to yield a keyed connection between the spindle rod 104 and the rotating table 122. In this fashion, the rotating table 122 can rotatingly engage the spindle rod 104 such that the rotating table 122 performs one revolution for every revolution of the spindle rod 104. Both the spindle rod 104 and the rotating table 122 can advantageously rotate concentrically about the centerline 113.

The rotating table 122 has a plurality of peripheral openings 218 that are defined within the rotating table 122 and arranged in a symmetrical fashion peripherally around an outer portion 220 of the rotating table 122. Each opening 218 forms a neck portion 222 and a gear cavity portion 224. A shaft 226 may connect a workpiece 228 with a cog or gear 230. The shaft 226 may pass through the neck portion 222 of a respective opening 218. The cog 230 may be positioned within the gear cavity portion 224 such that the entire assembly that includes the workpiece 228, the shaft 226, and the cog 230 may be free to rotate in unison with respect to the rotating table 122. Rotation of the workpiece 228 in this embodiment may advantageously be performed about an axis 232 of the shaft 226 and cog 230. The axis 232 of the workpiece 228 or, in general, the axis of eccentric rotation of the workpiece 228 with respect to the rotating table 122, may be arranged to be either parallel or have any other orientation with respect to the centerline 113 of the spindle rod 104. In this exemplary embodiment, the axis 232 is parallel to the centerline 113 of the spindle rod 104.

Figure 3:
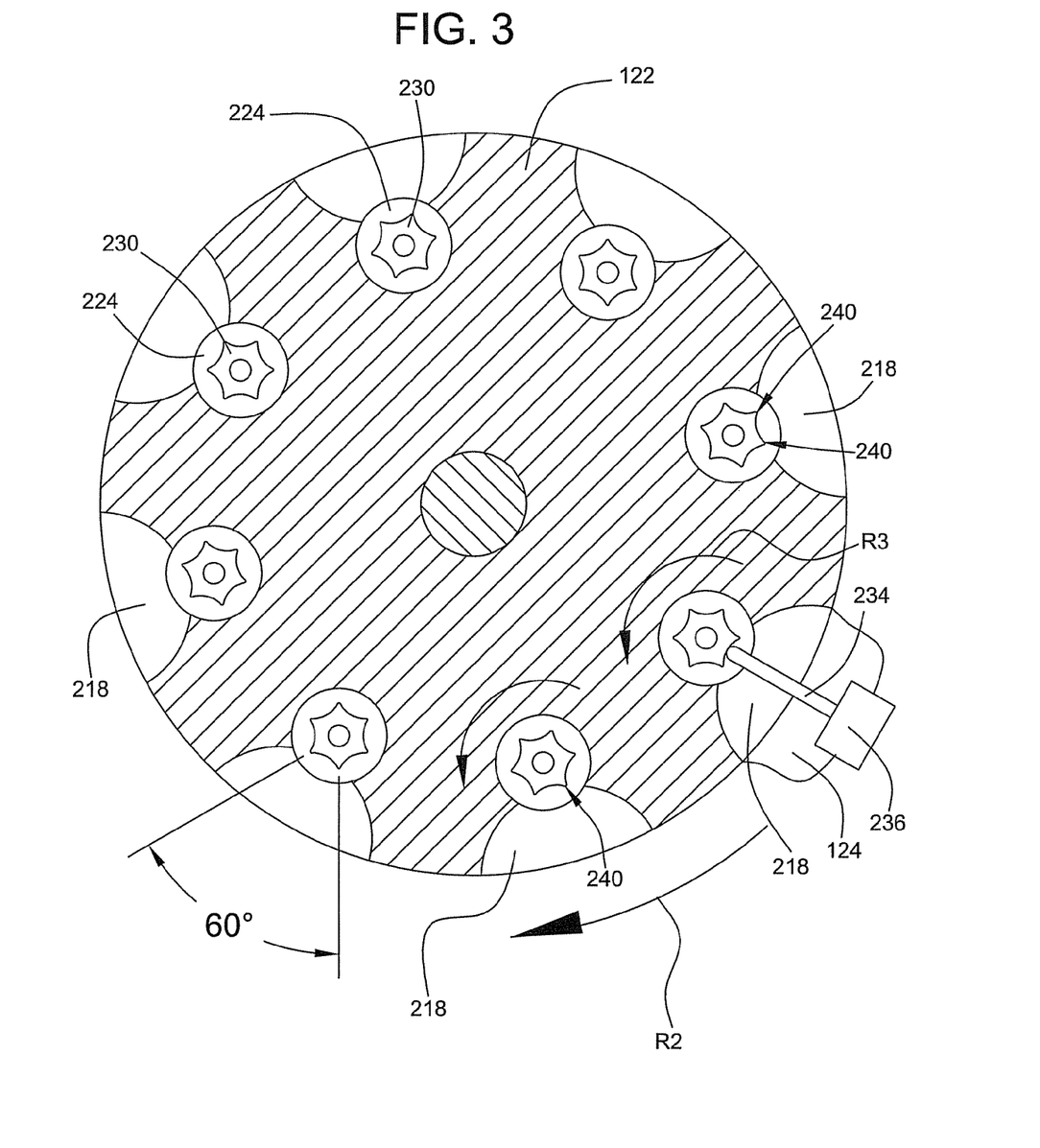
FIG. 3 is a cross section of a rotating workpiece support table.

The rotation of each of the workpieces 228 and associated components is segmented during over the continuous rotation of the rotating table 122. In the embodiment presented (with additional detail shown in FIG. 3), each workpiece 228 performs a sixty (60) degree rotation with respect to its axis for every full rotation of the rotating table 122. Hence, each workpiece 228 will perform a full rotation for every six rotations of the rotating table 122. Rotation of each workpiece 228 is accomplished by the intermittent engagement of each cog 230 with a driver finger 234. The driver finger 234 is connected to the stationary table 124 through a holder 236, and is advantageously stationary with respect to the rotating table 122. The driver finger 234, and associated mounting structure, is part of the module 120 and extends generally inward in a radial direction towards the centerline 113 of the spindle rod 104.

During operation, the rotating table 122 rotates with respect to the stationary table 124 and the driver finger 234. As shown more clearly in FIG. 3, while each opening 218 passes by the driver finger 234, a distal end or tip of the driver finger 234 enters the gear cavity portion 224 through the peripheral opening 218 and engages a tooth 240 that is formed on the cog 230. The engagement of the finger 234 with the tooth 240 angularly advances a rotational position of the cog 230 by a predetermined extent, in this example 60-degrees, with respect to the rotating table 122. This incremental rotation of the workpieces 228 occurs sequentially for each workpiece connected to the rotating table 122 and advantageously introduces the third degree of rotation, R3, to the workpieces 228 that are arranged in the workpiece support system 100.

Figure 4:
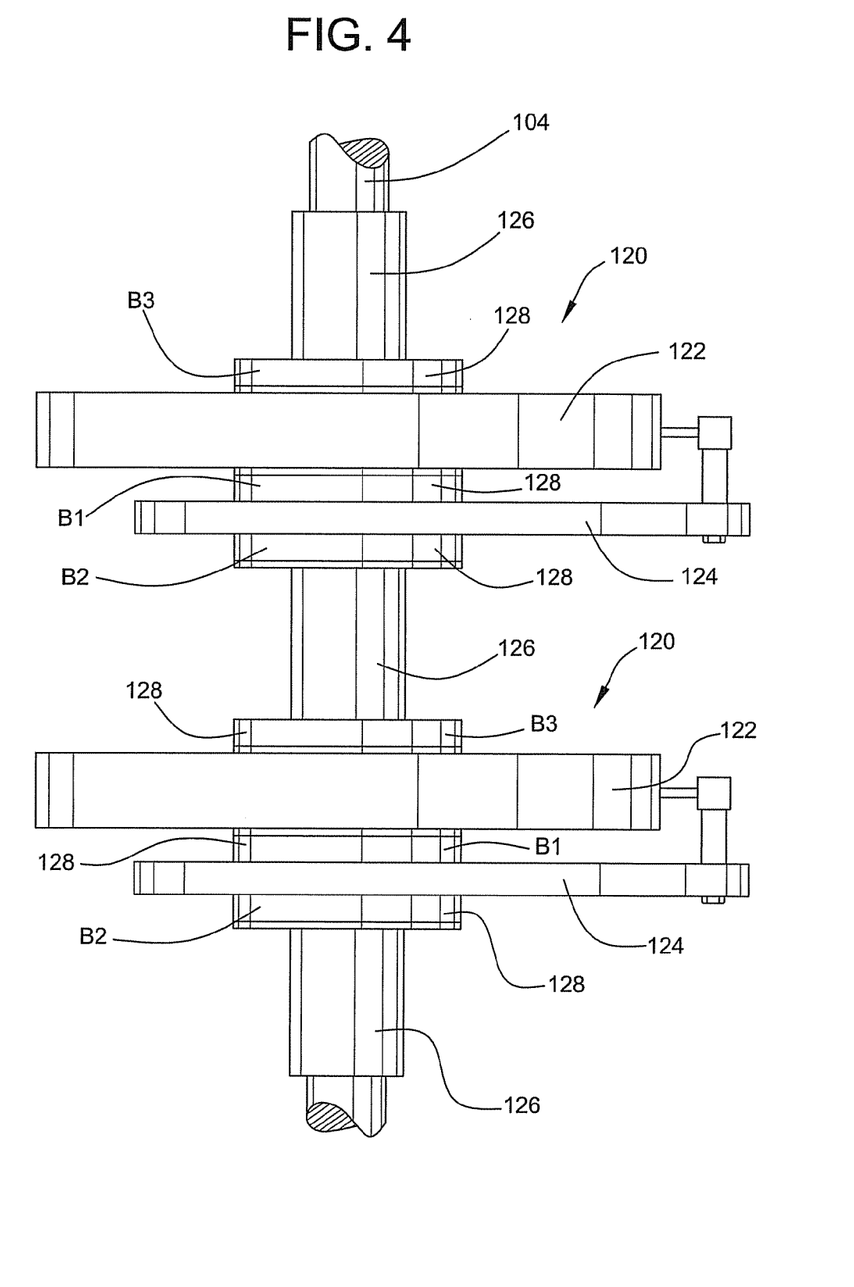
FIG. 4 is an alternate embodiment for an installation arrangement of a workpiece support module in accordance with the disclosure.

An alternative mounting arrangement for installing two modules 120 onto a segment of a spindle rod 104 is shown in FIG. 4. Various components are stacked around the rod 104 over each other. Beginning from the bottom portion of the figure, a spacer sleeve 126 is positioned beneath a stationary table 124 of a first module 120. A bearing 128 is positioned on top of the stationary table 124 separating it from the rotating table 122 of the first module 120. A second bearing 128 is positioned on top of the rotating table 122, and a second spacer sleeve 126 is positioned on top of the second bearing 128. The arrangement of bearings 128 previously described in relation to FIG. 2 involved locating the two bearings 128 around the stationary table 124, with their positions also shown here and denoted B1 and B2. In the alternative arrangement, the bearings 128 surround the rotating table 122 instead of the stationary table 124, with those positions denoted by B2 and B3. In general, one may use a bearing 128 in the location marked B1, and employ an additional bearing 128 in either the location marked B2, or the location marked B3, or at both locations B1 and B2 simultaneously. Alternate arrangements using three or more bearings to rotatingly isolate the various stacked components that may be included within or around each module are also contemplated.

INDUSTRIAL APPLICABILITY

The present disclosure is applicable to fixtures for machines used for coating workpieces. The fixtures described herein are advantageously capable of modular arrangements that permit a maximization of the capacity of a machine to accept workpieces being coated, and allow for operation of the machine that is not hindered by the same or similar issues as were present in prior machine configurations, for example, increase in friction during rotation of the various portions of the fixture with respect to each other. The fixture disclosed herein is advantageously capable of rotating the workpieces in three degrees of rotation, or alternatively, provides the workpieces with an orbital motion having three components. This mode of rotation of the components during a vapor deposition or coating process advantageously yields a more uniform coating on the workpieces over a sometimes shortened processing time.

Figure 5:
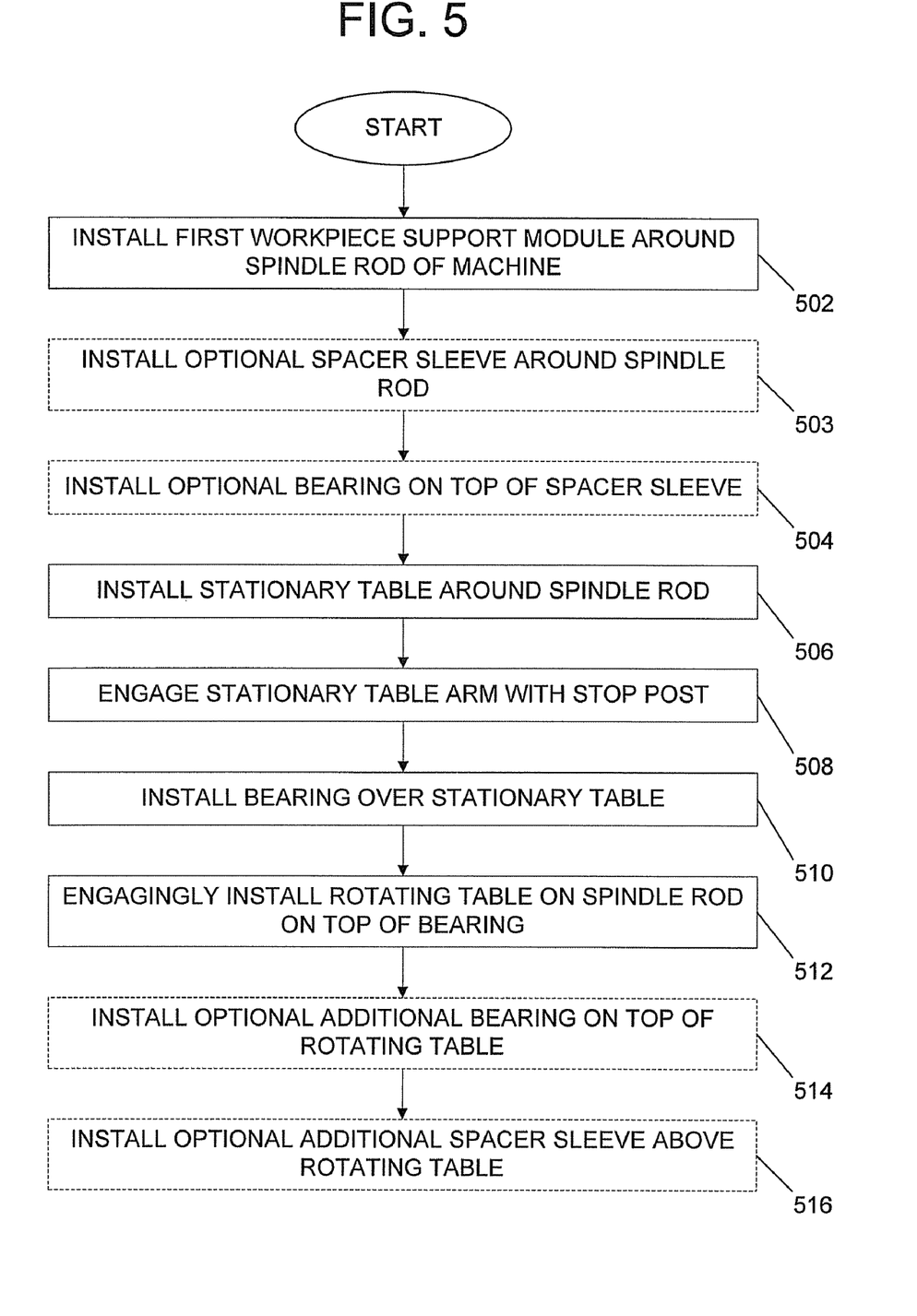
FIG. 5 is a flowchart for a method of assembling a workpiece support machine in accordance with the disclosure.

A flowchart for a method of supporting and re-orienting workpieces during a vapor deposition coating process is shown in FIG. 5. A machine having a plurality of spindle rods extending vertically therefrom is assembled by, first, installing a first module around one of the spindle rods of the machine at 502. The module installation includes the installation of a first optional bearing at 503, an optional spacer sleeve at 504, followed by installation of a stationary table at 506. The stationary table has an extension arm that is engaged with a stop post at 508. A bearing is installed around the spindle rod over the stationary table at 510. The bearing is then covered with a rotating table that is engageably installed around the spindle rod at 512.

Thereafter, an optional additional bearing can be installed over the rotating table at 514, another spacer sleeve is installed at 516, and the process is repeated until all spindle rods of the machine have been utilized and the capacity of the machine to support and re-orient workpieces has been maximized. Placement of the optional bearings depends on the desired configuration. For example, it is desired to rotatingly isolate the stationary table from the rotating table while still providing support to the rotating table. For this reason, a bearing should be installed to separate the stationary table from the rotating table. Nevertheless, because it is also desirable to reduce friction in the machine, placement of an additional bearing that will rotatingly isolate either the rotating table from the spacer sleeve that is placed on top of it or isolate the stationary table from the spacer sleeve that is placed below it is recommended.

Figure 6:
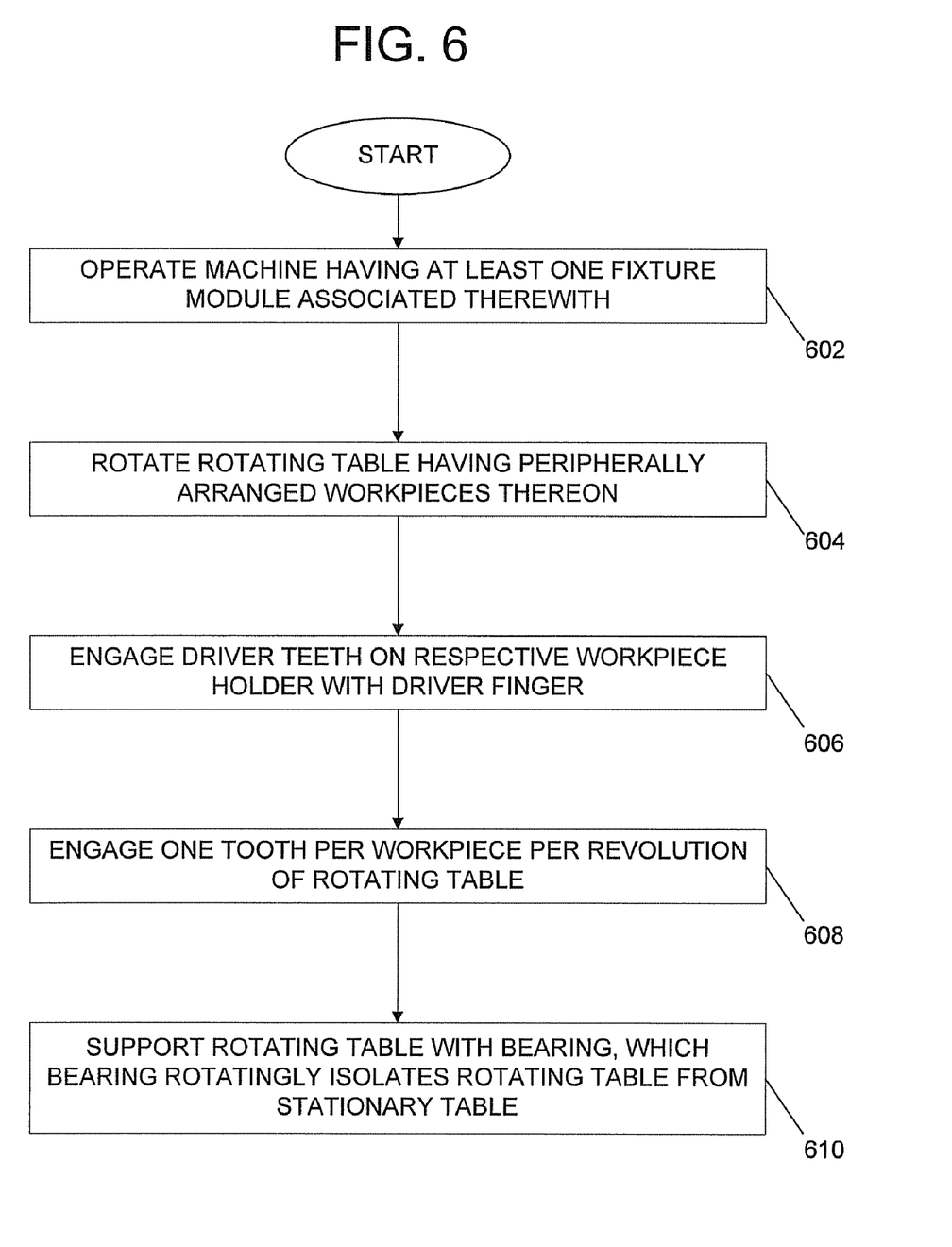
FIG. 6 is a flowchart for a method of operating a workpiece support machine in accordance with the disclosure.

A flowchart for a method of dynamically orienting at least one workpiece with respect to a spray nozzle during a vacuum coating operation is shown in FIG. 6. Here, an assembled machine having one or more fixture modules in accordance with the disclosure is operated at 602. During operation of the machine, a rotating table having at least one workpiece holder associated therewith is rotated by the action of the rotation of a spindle rod connected to a base table at 604. The workpiece(s) positioned on the machine is (are) rotatably disposed adjacent to an outer periphery of the rotating table with each workpiece resting on a respective holder that forms two or more teeth. Each tooth is engaged with a driver finger at 606. Each engagement between the driver finger and a tooth occurs once per revolution of the rotating table and operates to incrementally advance an angular position of the at least one workpiece holder with respect to the rotating table with each revolution of the rotating table at 608. As described, the rotating table is supported by a bearing that rotatingly isolates the rotating table from the stationary table at 610.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

We claim:

1. A workpiece support system, comprising:
  a base table having at least one rotating spindle rod associated therewith, the spindle rod extending in a vertical direction away from the base table, the spindle rod capable of powered rotation about a centerline of the spindle rod;
  at least one stop post, the stop post connected to the base table and extending in a vertical direction therefrom, the stop post having an elongate shape, the stop post disposed at a distance from the spindle rod and extending parallel therewith;
  at least one workpiece support module, the workpiece support module including:
    a rotating table having a central opening and a plurality of peripheral openings, the plurality of peripheral openings disposed symmetrically around a peripheral portion of the rotating table,
    the rotating table engagingly disposed around the spindle rod, wherein the spindle rod passes through and engages the central opening of the rotating table such that the rotating table rotates about the centerline when the spindle rod rotates,
    a stationary table axially supporting the rotating table vertically, the stationary table freely disposed around the spindle rod,
    the stationary table connected to the at least one stop post such that the stationary table remains stationary when the spindle rod rotates;
  at least one bearing disposed around the spindle rod, the at least one bearing rotatably isolating the rotating table from the stationary table,
  the at least one bearing disposed between the rotating table and the stationary table, wherein the at least one bearing separates the rotating table from the stationary table and wherein the at least one bearing is a roller bearing, the roller bearing including a bearing portion, a race portion, and a plurality of rollers disposed between the bearing and race portions.

2. The workpiece support system of claim 1, wherein the at least one support module further includes:
  a plurality of cogs disposed, one each, into the plurality of peripheral openings, each of the plurality of cogs being rotatable about a respective axis that is parallel to the centerline,
  each of the plurality of cogs having at least one tooth formed adjacent to an outer periphery thereof, and
  a driver finger connected to the stationary table,
  wherein the driver finger sequentially engages each of the at least one tooth of the plurality of cogs once per full revolution of the rotating table, such that an angular position of each of the plurality of cogs is incrementally advanced with respect to the rotating table.

3. The workpiece support system of claim 1, further including a spacer sleeve disposed around the spindle rod, the spacer sleeve disposed above the rotating table.

4. The workpiece support system of claim 3, further including an additional bearing disposed around the spindle rod between the rotating table and the spacer sleeve, the additional bearing rotatably isolating the rotating table from the spacer sleeve.

5. The workpiece support system of claim 1, further including a spacer sleeve disposed around the spindle rod, the spacer sleeve disposed below the stationary table.

6. The workpiece support system of claim 5, further including an additional bearing disposed around the spindle rod between the stationary table and the spacer sleeve, the additional bearing rotatably isolating the stationary table from the spacer sleeve.

7. The workpiece support system of claim 1, further comprising an additional workpiece support module disposed around the at least one spindle rod.

8. A fixture for supporting a plurality of workpieces within a vacuum chamber during a vapor deposition coating process, comprising:
    a base rotating table having at least two spindle rods extending vertically therefrom, each spindle rod having a corresponding stop post associated therewith, each stop post connected to the base rotating table, each stop post defining at least one stop opening;
    each spindle rod operating to rotate about a centerline thereof, rotation of each spindle rod being compounded with rotation of the base rotating table;
    a spacer sleeve disposed around at least one spindle rod, the spacer sleeve being disengaged from the rotation of the at least one spindle rod;
    a first bearing disposed around the at least one spindle rod, the first bearing having a race portion that is rotatably isolated from a bearing portion thereof;
    a stationary plate disposed around the at least one spindle rod, the stationary plate disposed over the first bearing and in contact with the bearing portion thereof;
    the stationary plate having a projection arm that is at least partially disposed within the stop opening of the corresponding stop post, the arm engaging the corresponding stop post such that the stationary plate does not rotate with respect to the base table when the at least one spindle rod is rotating;
    a second bearing disposed around the at least one spindle rod, the second bearing disposed over the stationary plate,
    the second bearing having a bearing portion in contact with the stationary plate, the second bearing having a race portion that is rotatably isolated from the race portion thereof;
    a workpiece support plate disposed around the spindle rod, the workpiece support engaged to the spindle rod such that the workpiece support rotates when the spindle rod rotates,
    the workpiece support contacting the race portion of the second bearing, the workpiece support adapted to support a workpiece.

9. The fixture of claim 8, wherein the workpiece support further includes:
    a plurality of peripheral openings, each peripheral opening containing an advancement cog,
    each advancement cog rotatably connected to the workpiece support, wherein each advancement cog is adapted to rotate about a respective axis that is parallel to the centerline of the spindle rod;
    each advancement cog forming a plurality of teeth along an outer portion thereof;
    a plurality of slots defined along a laterally extending peripheral surface of the workpiece support, each slot corresponding to a respective peripheral opening, each slot forming a respective single cavity within the workpiece support with a respective peripheral opening.

10. The fixture of claim 9, further including a drive finger, the drive finger connected to a holder, the holder connected to the stationary table.

11. The fixture of claim 10, wherein the drive finger operates to incrementally rotate each cog by entering through each slot sequentially as the workpiece support rotates and engaging a tooth.

12. The fixture of claim 10, wherein the first bearing is a roller bearing, the roller bearing having a bearing portion and a race portion connected to each other along a sealed interface.

* * * * *